United States Patent

Pittman et al.

[15] 3,691,298

[45] Sept. 12, 1972

[54] TOUCH TUNING AND CONTROL CIRCUITS

[72] Inventors: Carl R. Pittman; James A. Long, both of Arvin Industries, Inc., Columbus, Ind. 47201

[22] Filed: Dec. 3, 1970

[21] Appl. No.: 94,896

[52] U.S. Cl. ...............179/1 VL, 179/1 D, 323/22 T, 320/1

[51] Int. Cl. ...............................................H03g 1/02

[58] Field of Search..307/246, 251; 323/22 T; 320/1; 338/69, 92, 96; 179/1 VL, 1 D

[56] References Cited

UNITED STATES PATENTS

| | | | |
|---|---|---|---|
| 3,560,768 | 2/1971 | Rimkus | 307/251 |
| 3,454,789 | 7/1969 | Tyler et al. | 320/1 |
| 2,186,825 | 4/1938 | Dome | 200/166 C |
| 2,141,231 | 12/1938 | Trautwein | 338/69 |
| 1,847,119 | 3/1932 | Lertes et al. | 338/69 |
| 3,596,109 | 7/1971 | Marshall | 307/251 |

*Primary Examiner*—William C. Cooper
*Assistant Examiner*—Douglas W. Olms
*Attorney*—Trask, Jenkins and Hanley

[57] ABSTRACT

An electronic circuit for adjusting the volume and tone of an audio signal is controlled by appropriately bridging contacts included therein with a human finger or other conductive means. The length of time that a contact is bridged, or closed, determines the conductive state of a field effect transistor associated therewith. One such FET controls the gain of an audio amplifier whereby the amplitude of the audio signal is controlled. The conductive state of a second such FET controls the biasing voltage on a junction transistor to control the shunting of the high frequency components of the audio signals.

The audio output is coupled to varactor tuning means so that a change in the conductive state of an FET changes the frequency to which the varactor tuning means is tuned.

16 Claims, 2 Drawing Figures

PATENTED SEP 12 1972 3,691,298

INVENTORS
CARL R. PITTMAN
JAMES A. LONG
BY
Trask, Jenkins & Hanley
ATTORNEYS

TOUCH TUNING AND CONTROL CIRCUITS

BACKGROUND OF THE INVENTION

Radios, T.V.'s, and tape recorders are normally provided with mechanically adjustable potentiometers to effect changes in their volume, tone and station. Such tuning means, however, introduce a significant weakness into the system in that their susceptibility to frictional wear reduces the overall dependability of the device.

Solid state circuitry has also made possible, at relatively low cost, a relative high degree of sensitivity in audio applications. To produce a mechanical tuning means having a degree of sensitivity comparable to that of the circuit which it is to adjust is costly, and in the production of consumer products, economically prohibitive.

It is therefore an object of this invention to provide essentially wear-free volume, tone and station control of a radio or television circuit at a cost equal to, or less than, standard mechanical tuning means.

SUMMARY OF THE INVENTION

In this invention a memory capacitor may be used to control the conductive state of a field effect transistor to which it is coupled. Contact means provided in the charging path of this capacitor are adapted to be bridged by a human finger, or the like, thereby making the charge on the capacitor a function of the length of time these contacts are bridged.

The volume or amplitude control portion of a circuit embodying the invention uses such a memory capacitor-FET combination for controlling the amount of forward bias on the base-emitter junction of a junction transistor. An audio signal, also coupled to the base electrode of this audio amplifier, is thereby amplified in accordance with the conductive state of the FET.

A memory capacitor-FET combination may also be used to control the tone of an audio signal after it has been amplified. The source electrode of the FET is DC coupled to the base electrode of a junction transistor whereby the amount of forward biased of the base-emitter junction of this transistor becomes a function of the conductive state of the FET. By coupling this transistor's emitter electrode to the collector electrode of the audio amplified, and its own collector electrode to AC ground, the high frequency shunting of the audio signal may be regulated by the conductive state of this transistor.

An alternate embodiment of the invention provides means to tune a radio, T.V. or other receiver to any specific station in the broadcasting band by touching a tuning strip in an appropriate location. A conductive strip-resistor combination may be used such that pressure at any place along this strip will cause contact to be made between the strip and the resistor, thereby applying to the memory capacitor the voltage at that location on the resistor. When the pressure is removed, the capacitor holds its charge and maintains an FET in a state of conduction corresponding to the place in which the conductive strip was pressed. The level of conductivity of the FET is reflected in the voltage which is applied to a tuning circuit containing variable capacitance diodes (varactors). When reversed biased, the capacitance of such diodes varies with the voltage applied, thereby changing the resonant frequency of the tuned circuit of which it is a component.

BRIEF DESCRIPTION OF THE DRAWINGS

The invention is illustrated in the drawing in which.

DESCRIPTION OF THE PREFERRED EMBODIMENT

Figure 1:
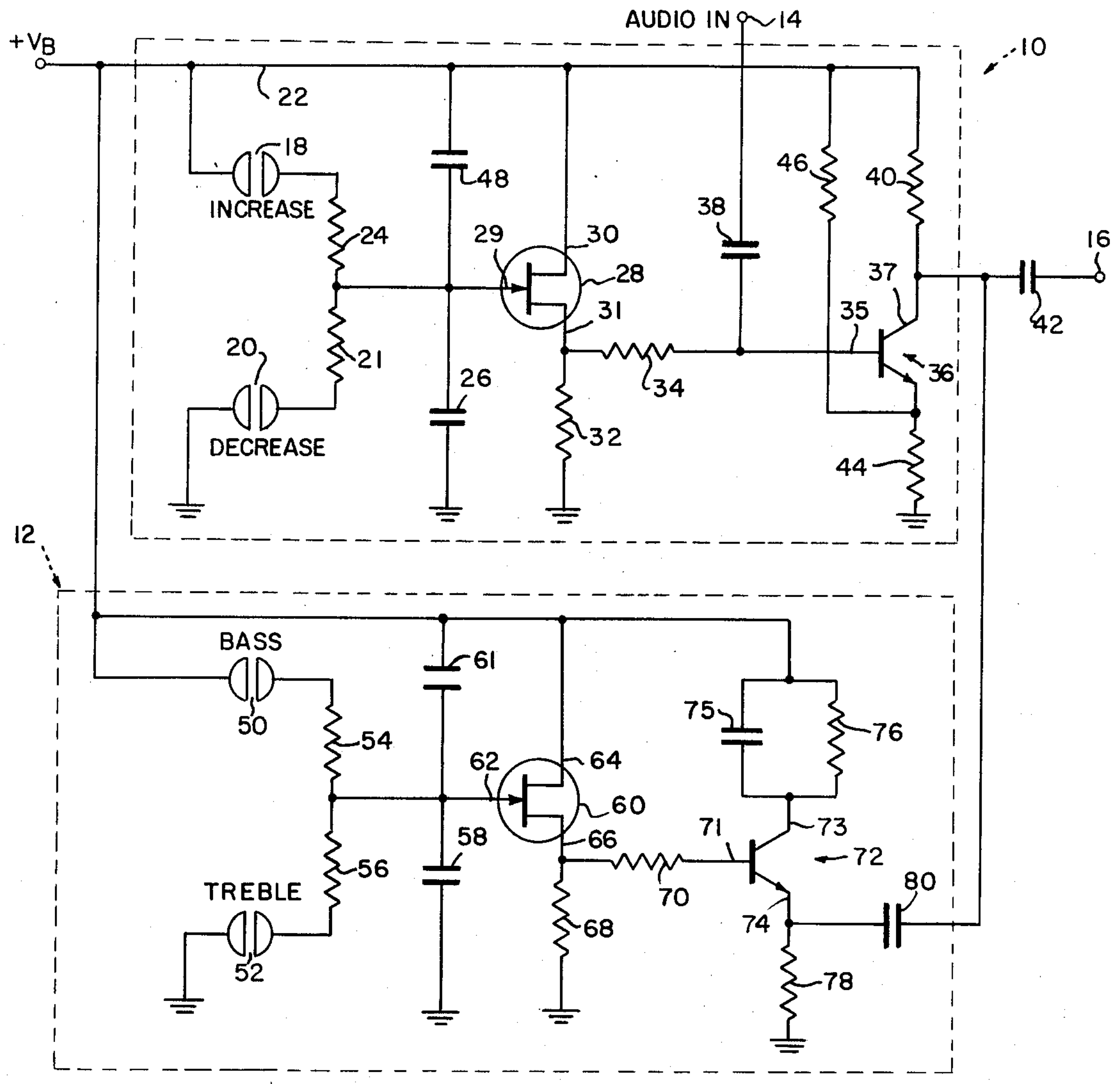
FIG. 1 is a schematic diagram of a volume and tone control circuit embodying this invention.

The circuitry for the volume control 10 and tone control 12 is illustrated in FIG. 1. An audio signal is applied to the circuit by conductor 14. Before appearing on output conductor 16, the audio signal may be amplified and its tone modified according to the quality and quantity of output desired by the user.

Control of the volume level is achieved by bridging one of two contacts 18 and 20, for example, with a human finger. When contact 18 is closed in this manner a charging path for memory capacitor 66 is provided through charging resistor 24. As long as contact 18 is bridged, capacitor 26 will continue to charge towards the $+_B$ voltage.

The voltage to which capacitor 26 is charged is also present on the gate electrode 29 of a field effect transistor (FET) 28. Since an FET may be constructed as a symmetrical device, the drain and source electrode connections hereinafter described may be interchanged with the same results being obtained. As this voltage increases toward a more positive value, the FET 28 becomes progressively more conductive, and the voltage from its drain electrode 30 to the source electrode 31 is reducted accordingly. As this happens, an increasing amount of $+V_B$ voltage is applied across a source resistor 32 which is connected between the FET's source electrode 31 and ground. The source electrode 31 of FET 28 is also DC coupled by means of a coupling resistor 34 to the base electrode 35 of a junction transistor 36 used as an audio amplifier. Either type of junction transistor, NPN or PNP, may be used with, of course, the appropriate change in polarity of biasing voltage. An NPN type transistor will be used hereinafter as representative of both types.

As the voltage drop across the source resistor 32 increases, the voltage drop from the base electrode 35 of the transistor amplified 36 to ground also increases, and serves to provide an increasing amount of forward bias across the base emitter junction of that transistor 36, thereby making this transistor more conductive. A conductor 14 carrying the audio signal is coupled to the base 35 of this transistor amplifier 36 by coupling capacitor 38. The degree of conductivity of transistor 36 within the range specified by its biasing resistors 40, 44 and 46, thereby directly regulates the amplitude of the audio output signal appearing on the collector electrode 37 of the transistor 36. This signal is coupled to output conductor 16 by a coupling capacitor 42 to prevent the DC component of the signal from being passed on.

Looking again at the volume increase contact 18, once the bridging is removed, as by removing a finger, the charging path for capacitor 26 is broken. By using a low leakage capacitor for the memory capacitor 26, the voltage which has been impressed on the gate 29 of FET 28 may be maintained over long periods of time.

To decrease the volume, a second contact 20 may be bridged, for example, by a human finger, thus providing a path for the memory capacitor 26 to discharge through a discharging resistor 21. This decreases the voltage on the gate electrode 29 of the FET 28, and the resulting decrease in the conduction state of the transistor amplifier 36 reduces the amplitude of the audio signal appearing on output conductor 16.

In using a junction type FET for volume control, the volume setting is lost when the receiver is turned off and then back on. To overcome this disadvantage, an insulated gate field effect transistor may be used. This type of FET is more expensive, however. To provide a less expensive circuit than that using the insulated gate FET and yet minimize the disadvantage of losing the volume setting entirely, a second capacitor 48 is connected from the gate 29 to the conductor 22 carrying the $+V_B$ voltage. This capacitor 48 is charged whenever the $+V_B$ voltage is turned on. Since this voltage is present on gate 29, capacitor 26 also charges to this value. The value of capacitor 48 can be chosen so that the receiver will always come on at a certain volume level. The desired listening level can then, of course, be obtained by touching contacts 18 or 20.

The tone of the audio output can be adjusted by touching either the bass contact 50 or the treble contact 52. If the bass contact 50 is bridged, a charging path for a memory capacitor 58 is provided across a charging resistor 54 to the $+V_B$ voltage. When the treble contact 52 is bridged, a discharging path is provided for the memory capacitor 58 across a discharging resistor 56 to ground. In this manner, when the bass contact 50 is touched to effect its closing, the voltage on the gate electrode 62 of an FET 60 connected to this capacitor 58 increases, and when the treble contact 52 is touched the voltage on the gate electrode 62 decreases. As the voltage on its gate 62 varies, the conduction state of FET 60 also varies. This change is reflected in the amount of voltage dropped across the source electrode resistor 68. A capacitor 61 can be connected from the gate 62 to the $V_B+$ voltage which, like its counterpart capacitor 48 in the volume control 10, minimizes the effect, in this case on the tone setting, of turning the receiver off. The voltage on the source electrode 66''. The voltage on the source electrode 66 is DC coupled by a resistor 70 to the base electrode 71 of an NPN transistor 72. The transistor 72 has a capacitor 75 and resistor 76 connected in parallel between its collector electrode 73 and the $+V_B$ voltage conductor 22. Its emitter electrode 74 is connected to ground through a resistor 78 and to the collector 37 of the amplifier transistor 36 through a capacitor 80.

As the DC voltage on the base of the NPN transistor 72 is increased in a positive direction, its conduction increases whereby the resistance between its collector and emitter electrodes is decreased. When this occurs, an effective shunting path for the high frequency audio signals is provided from the collector 37 of the transistor amplifier 36 through capacitor 80 and capacitor 75 to AC ground, which is, in this case, the $+V_B$ conductor 22. When the positive voltage on the base 71 of the NPN transistor 72 is decreased, by bridging the treble contact 52, this transistor 72 conducts less, which inhibits the shunting effect of the high frequency signals, thereby increasing the treble quality in the audio signal present in the amplifier output conductor 16.

When a human finger is used to bridge either the increase or decrease contacts in either the tone or volume control circuits, a hum may be introduced into the audio output signal or the resistance of the human skin may cause a time delay, thereby increasing the amount of time for the desired level of volume or tone to be reached. To overcome these problems, a combination strip of smooth plastic resilient tape and a conductive tape, such as Mylar, may be used to bridge the contacts when pressure is applied by a human finger.

Figure 2:
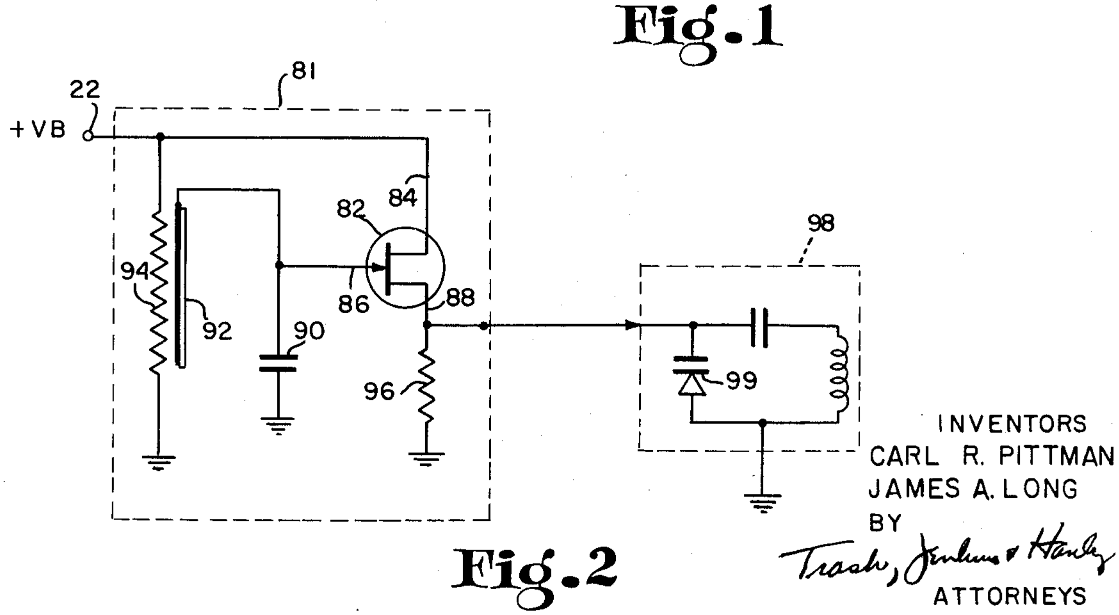
FIG. 2 is a schematic diagram of an alternate embodiment of the invention.

The circuitry for an alternate embodiment of my invention is shown in FIG. 2. The control circuit 81 depicted therein is connected to a varactor tuning circuit 98 for selecting a station to which a radio or T.V. is tuned.

A wire wound resistor 94 is connected between the $+V_B$ voltage conductor 22 and ground. A conducting strip 92 to be used therewith, is comprised of a conductive mylar tape over which a smooth plastic resilient tape has been fixed. Slight pressure at any point on the strip 92 will make contact with a respective point on the resistor 94. This combination thereby forms a potentiometer whose resistance varies according to the point at which pressure is applied along its length. Alternately, a finger may be used to bridge the space between the conductive strip and the resistor, instead of bending the strip.

The conducting strip 92 is connected to one side of a capacitor 90 and to the gate electrode 86 of a FET 82. When contact is made between the strip 92 and resistor 94 the voltage across the increment of resistance between the place of contact and the $+V_B$ voltage conductor 22 is applied to capacitor 98 and to the gate electrode 86. This voltage causes the FET 82 to partially conduct, thereby reducing the voltage drop from the FET's drain electrode 84 to its source electrode 88. This change in voltage drop is reflected across the source resistor 96 connected between the source electrode 88 and ground. A varactor tuning circuit 98 is connected in parallel to this source resistor 96.

The varactor tuning circuit 98 comprises a tuned circuit in which one of the components is a varactor 99, that is, a capacitor whose capacitance is a function of the voltage applied across its terminals. In the present circuit, as the voltage across source resistor 96 changes, the voltage across the varactor correspondingly changes, whereby the resonant frequency of the tuned circuit 98 is altered which effects a change in the station to which the receiver is tuned.

We claim:

1. A voltage control comprising, a voltage source, first and second resistors, a field effect transistor having gate, drain and source electrodes, one of said drain and source electrodes being connected to one side of said voltage source, the other of said drain and source electrodes being coupled through said second resistor to the other side of said voltage source, a capacitor connected between said gate electrode and said other side of said voltage source, contact means having first contacts adapted to connect said gate electrode through said first resistor to said one side of said voltage source, whereby the voltage across said second resistor is varied when said first contacts are bridged.

2. The invention as set forth in claim 1 including a third resistor connected in series to said first resistor, wherein said contact means includes second contacts adapted to connect said gate electrode through said third resistor to said other side of said voltage source when said second contacts are bridged.

3. The invention set forth in claim 1 wherein said first resistor comprises a potentiometer having its arm connected to said gate electrode.

4. The invention set forth in claim 1 wherein said field effect transistor is an insulated gate field effect transistor.

5. A volume control comprising a voltage source, first and second resistors, a field effect transistor having gate, drain, and source electrodes, one of said drain and source electrodes being connected to one side of said voltage source, the other of said drain and source electrodes being connected through said second resistor to the other side of said voltage source, a capacitor connected between said gate electrode and said other side of said voltage source, contact means having contacts adapted to connect said gate electrode through said first resistor to said one side of said voltage source when said contacts are bridged, a junction transistor with base, collector, and emitter electrodes, said junction transistor having its base-emitter junction forward biased, said second resistor being DC coupled to said base electrode, audio input means coupled to said base electrode, and said collector electrode being coupled to audio output means, whereby the voltage on said audio output means is varied when said contacts are bridged.

6. The invention as set forth in claim 5 wherein said field effect transistor is an insulated gate field effect transistor.

7. An audio tone control comprising a voltage source, first and second resistance means, a field effect transistor having drain, source and gate electrodes, one of said drain and source electrodes being connected to one side of said voltage source, the other of said drain and source electrodes being connected through said first resistance means to the other side of said voltage source, a first capacitor being connected between said gate electrode and said other side of said voltage source, contact means adapted to connect said gate electrode through said second resistance means to said one side of said voltage source, a junction transistor having base, collector and emitter electrodes, said transistor having its base-emitter junction forward biased, said first resistance means, being coupled to said base electrode, a resistor and second capacitor connected in parallel between said collector electrode and said one side of said voltage source, and a third capacitor coupled between said emitter electrode and the output of an audio stage, said second and third capacitors effectively shunting the load on the audio stage when said contact means is closed.

8. The invention as set forth in claim 7 with the addition of a fourth capacitor connected between said gate electrode and said one side of said voltage source.

9. The invention as set forth in claim 7 wherein said field effect transistor is an insulated gate field effect transistor.

10. A volume and tone control for an audio system comprising, a voltage source, first and second resistance means, first and second field effect transistors each having gate, drain and source electrodes, one of said drain and source electrodes for each FET being connected to one side of said voltage source, the other of said drain and source electrodes of each FET being coupled respectively through first and second resistors to the other side of said voltage source, first and second capacitors connected respectively between said gate electrodes and said other side of said voltage source, first and second contact means adapted to connect said first and second gate electrodes through said first and second resistance means to said one side of said voltage source, first and second junction transistors having base, emitter and collector electrodes, each of said transistors having its base-emitter junction forward biased, said first resistor being coupled to said first transistor base electrode, audio input means coupled to said first transistor base electrode, said first transistor collector electrode being coupled to audio output means, whereby the voltage on said audio output varies in accordance with the closing of said first contact means, said second resistor being coupled to said second transistor base electrode, a third capacitor and resistor connected in parallel between said second transistor collector electrode and said one side of said voltage source, and a fourth capacitor coupled between said second transistor emitter electrode and said first transistor collector electrode, said third and fourth capacitors effectively shunting the load of said first transistor when said second contact means is closed.

11. The invention as set forth in claim 10 with the addition of a fifth and a sixth capacitor connected between said gate electrodes of each FET respectively, and said one side of said voltage source.

12. The invention as set forth in claim 10 wherein said first and second field effect transistors are insulated gate field effect transistors.

13. A voltage control comprising, a voltage source, first and second resistance means, a field effect transistor having gate, drain and source electrodes, one of said drain and source electrodes being connected to one side of said voltage source, the other of said drain and source electrodes being coupled through said second resistance means to the other side of said voltage source, a first capacitor connected between said gate electrode and said other side of said voltage source, a second capacitor connected between said gate electrode and said one side of said voltage source, and contact means adapted to connect said gate electrode through first resistance means to said one side of said voltage source, whereby the voltage across said second resistance means is varied when said contact means is closed.

14. The invention as set forth in claim 13 including a third resistance means connected in series to said first resistance means wherein said contact means is adapted to connect said gate electrode through said third resistance means to said other side of said voltage source.

15. The invention set forth in claim 13 wherein said first resistance means comprises a potentiometer having its arm connected to said gate electrode.

16. A volume control comprising a voltage source, first and second resistance means, a field effect transistor having gate, drain, and source electrodes, one of said drain and source electrodes being connected to one side of said voltage source, the other of said drain and source electrode being connected through said second resistance means to the other side of said voltage source, a first capacitor connected between said gate electrode and said other side of said voltage source, a second capacitor connected between said gate electrode and said one side of said voltage source, and contact means adapted to connect said gate electrode through said first resistance means to said one side of said voltage source, a junction transistor with base, collector, and emitter electrodes, said junction transistor having its base-emitter junction forward biased, said second resistance means being DC coupled to said base electrode, audio input means coupled to said base electrode, and said collector electrode being coupled to audio output means, whereby the voltage on said audio output means is varied when said contact means is closed.

* * * * *